United States Patent [19]

Mortensen et al.

[11] Patent Number: 4,582,219

[45] Date of Patent: Apr. 15, 1986

[54] STORAGE BOX HAVING RESILIENT FASTENING MEANS

[75] Inventors: Roger L. Mortensen, Victoria; Barry Gregerson, Chanhassen; Jeffrey J. Smith, Chanhassen; Larry G. Dressen, Chanhassen, all of Minn.

[73] Assignee: EMPAK, Inc., Chanhassen, Minn.

[21] Appl. No.: 703,507

[22] Filed: Feb. 20, 1985

[51] Int. Cl.$^4$ .............................................. B65D 45/16
[52] U.S. Cl. ...................................... 220/326; 220/324
[58] Field of Search ........................ 220/306, 326, 324

[56] References Cited

U.S. PATENT DOCUMENTS

3,841,518 10/1974 Hines .................................... 220/326
3,843,013 10/1974 Brooks, Jr. ........................... 220/326

Primary Examiner—George T. Hall
Attorney, Agent, or Firm—Hugh D. Jaeger

[57] ABSTRACT

Storage box including a box, a box door, and two locking clips. The storage box is used with standard mechanical interface (SMIF) transfer equipment, and is sealable, dust proof, and stackable. The box door includes cross-bar locators for cross-bar wafer cassettes, and a notch for cover alignment with the SMIF box door. The box door will also accept other types of wafer processing cassettes. Each of the locking clips engage into a clip enclosure outboard of the box, and includes a locking slot for the locking clip, as well as a latch pin opening which provides for movement of the latch pin.

1 Claim, 9 Drawing Figures

STORAGE BOX HAVING RESILIENT FASTENING MEANS

BACKGROUND OF THE INVENTION

1. Field of the Invention

The present invention pertains to a storage box for wafer cassettes, and more particularly, pertains to a standard mechanical interface (SMIF) storage box, including a box, box door, and locking clips for encompassing a wafer cassette.

2. Description of the Prior Art

The SMIF box, SMIF standing for Standard Mechanical Interface equipment, is an industry-wide uniform interface for transferring a wafer cassette carrying a plurality of silicon wafers between boxes or into and out of processing equipment. The SMIF box provides a clean room environment for the wafers inside the boxes, as well as equipment canopies isolated from an operator's environment. The group which designated the standard specifications for SMIF designed an entirely new system, as well as dictating specifications requiring a new design for the SMIF box, box door, and locking mechanism.

The prior art boxes have not been acceptable to robotic processing equipment, and also have not provided the necessary wafer environment inside the storage boxes. Prior art storage boxes have not been compatible nor oriented for robotic processing equipment, especially state of the art robotic processing equipment for handling of wafer cassettes, including cross-bar wafer cassettes in storage boxes, such as that designed under the SMIF concept.

The present inventions overcomes the disadvantages of the prior art by providing a storage box designated for use in standard mechanical interface (SMIF) equipment for processing of wafers held in a wafer cassette, the wafer cassette being housed in the SMIF storage box.

SUMMARY OF THE INVENTION

The general purpose of the present invention is a standard mechanical interface (SMIF) storage box, including a box, a box door, and two locking clips. The storage box is compatible to the standard mechanical interface equipment for processing of silicon wafers held in a wafer processing cassette, such as a cross-bar wafer processing cassette, and for use in robotic processing equipment, such as the type which includes a canopy over the equipment and an interface port for accepting the SMIF storage box. The SMIF storage box provides a clean room space within the SMIF storage box, thereby isolating the wafers from contaminates in the outside environment.

According to one embodiment of the present invention, there is provided a SMIF storage box, including a box, a box door, and two locking clips which engage into outboard clip enclosures, and locking slots in each of the outboard clip enclosures. The locking clips each include spring latches which engage into lock interfaces of the door. The spring latch of the locking clip is provided with a latch pin engagement area for robotic unlatching of the spring latch for releasing of the door. A wafer locator rib is provided in the box for orienting the door to the box. The door includes a plurality of locator flanges for acceptance of crossbar cassettes, metal cassettes, and other cassettes. Tabs also extend upwardly to prevent misorientation of a cassette with respect to the door.

One significant aspect and feature of the present invention is a SMIF storage box which is sealable, dust proof and stackable. The storage box is also easily disassembled providing for thorough cleaning.

Another significant aspect and feature of the present invention is a SMIF storage box which includes handle provisions for each of operator handling or ease of robotic gripper handling.

A further significant aspect and feature of the present invention is a SMIF storage box which is compatible with standard specifications for standard mechanical interface transfer equipment. Specifically, the box can be used in equipment, including a canopy, elevator, interface port, and manipulator.

Having thus described embodiments of the present invention, it is the principal object hereof to provide a storage box which is compatible with standard specifications for standard mechanical interface (SMIF) transfer equipment. The storage box includes a box, a box door, and two locking clips.

One object of the present invention is a SMIF box that is designed for robotic handling equipment. Particularly, the box provides for being handled by a robotic gripper and for storing a wafer processing cassette including a plurality of round silicon wafers.

DESCRIPTION OF THE PREFERRED EMBODIMENTS

Figure 1:
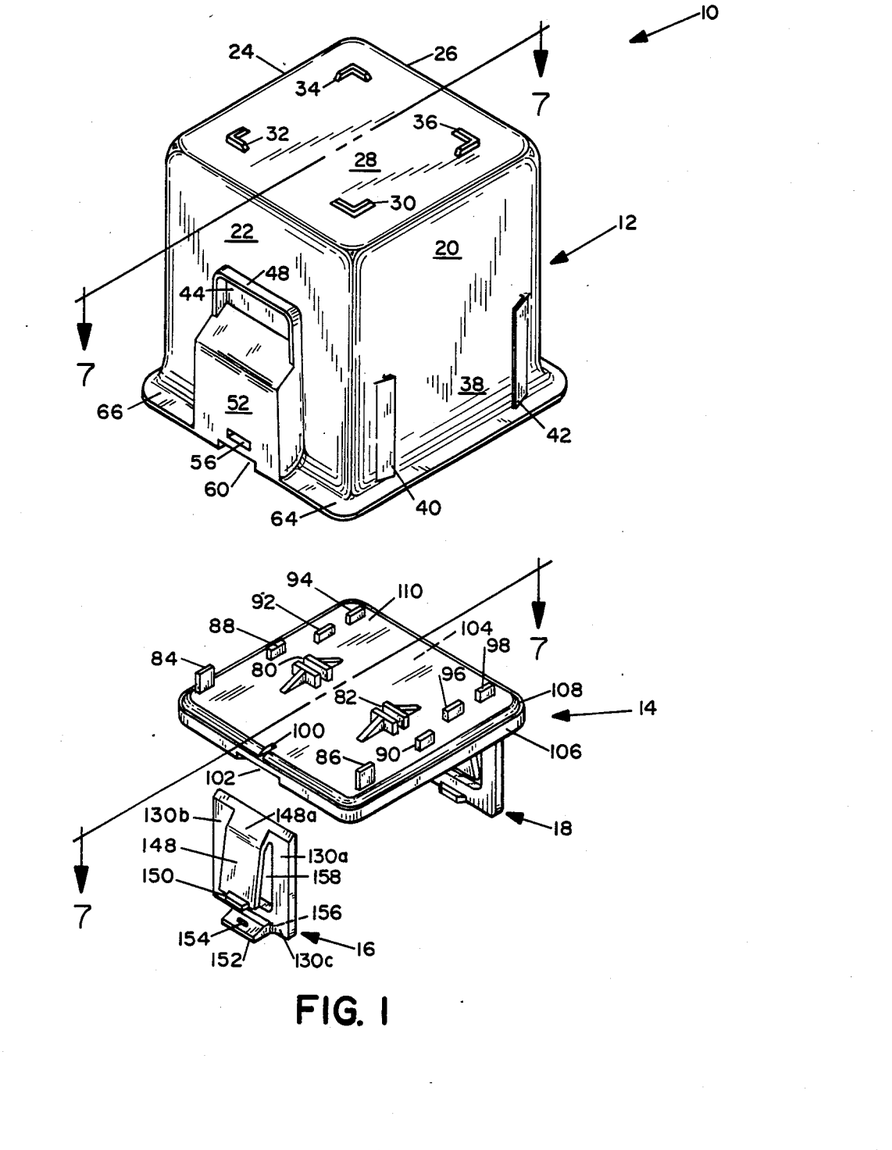
FIG. 1 illustrates a perspective view of components for a storage box, including a box, a door, and two locking clips.
Figure 2:
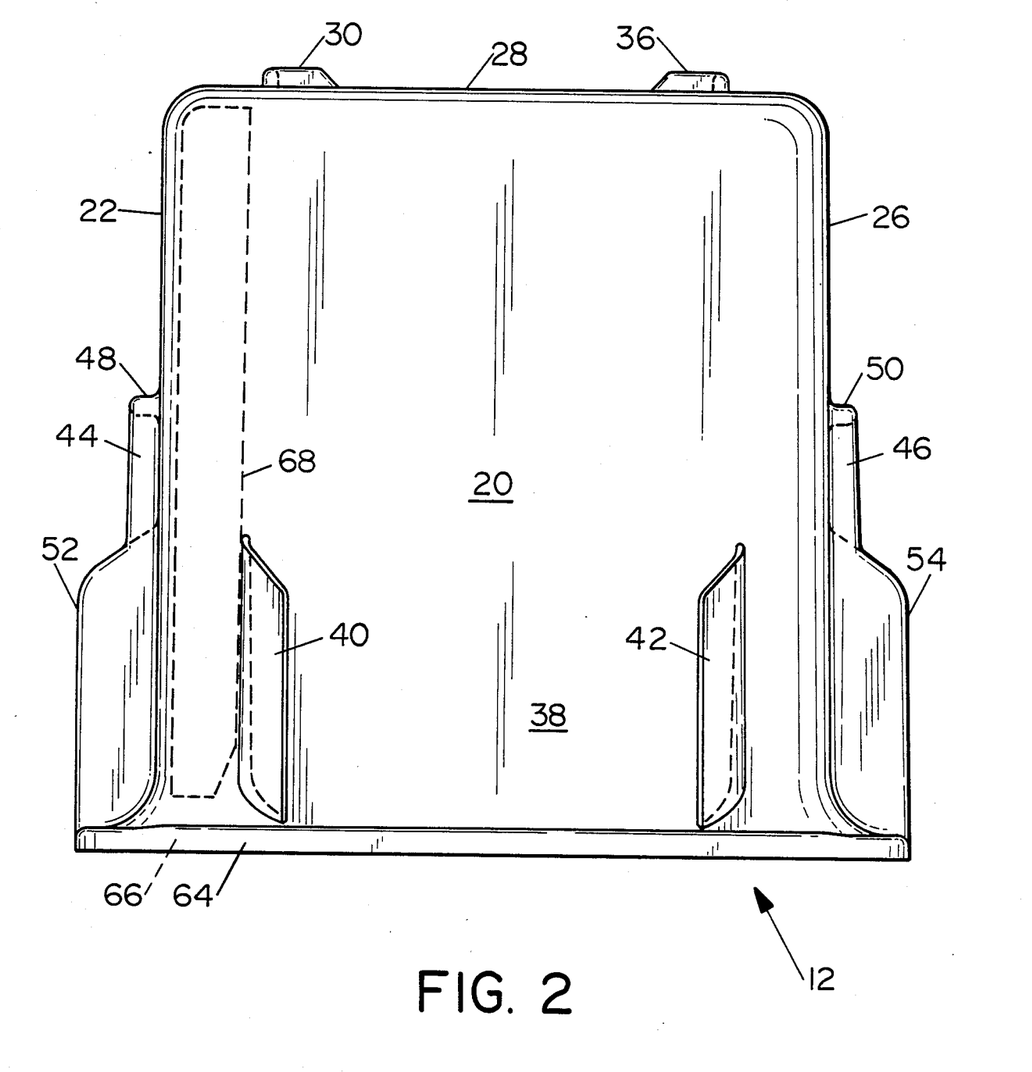
FIG. 2 illustrates a side elevation of the storage box.
Figure 3:
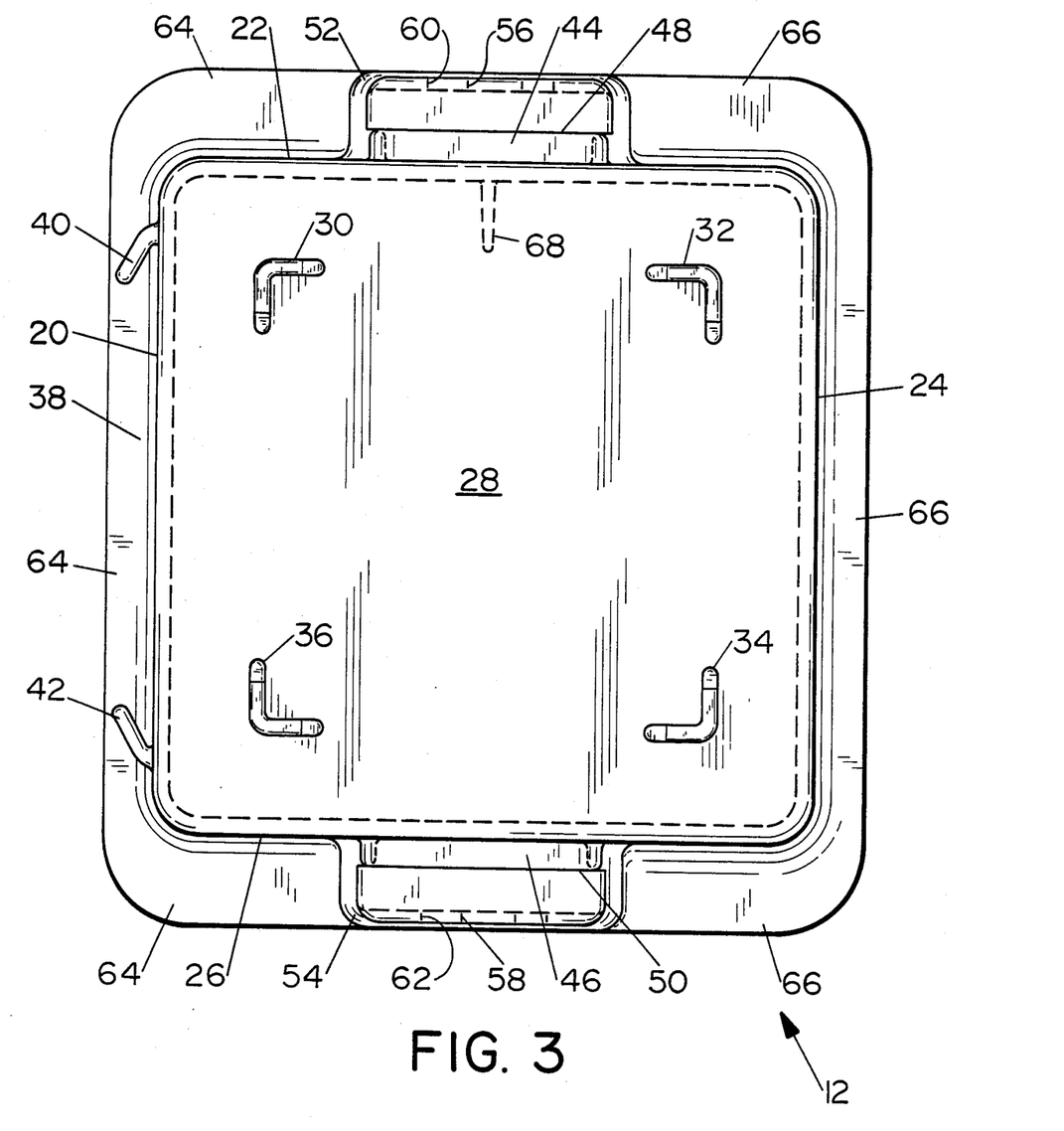
FIG. 3 illustrates a top view of the storage box.
Figure 4:
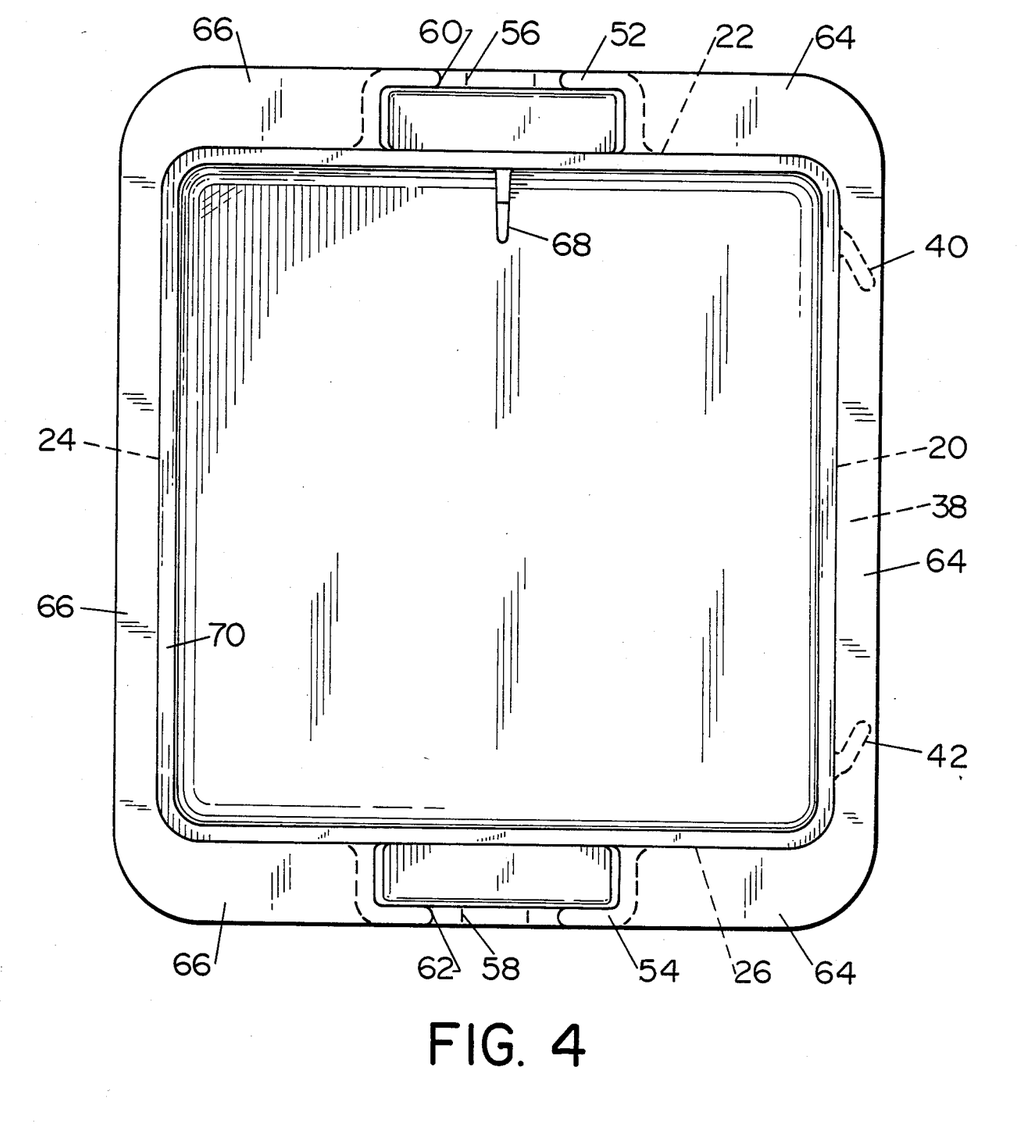
FIG. 4 illustrates a bottom view of the storage box.
Figure 7:
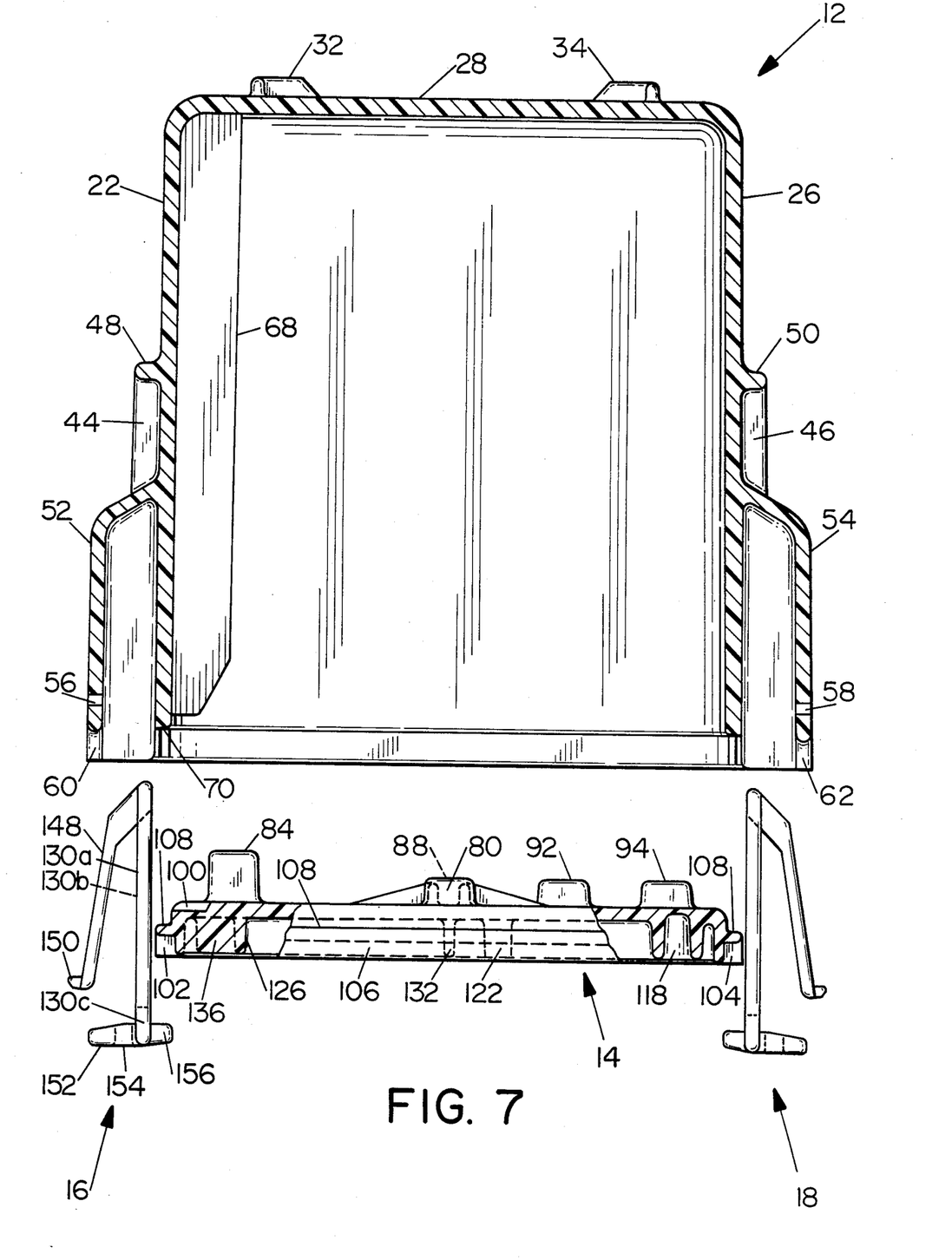
FIG. 7 illustrates a cross sectional view of the storage box, door, and locking clips along section lines 7—7 of FIG. 1 as they are separated prior to engagement.
Figure 9:
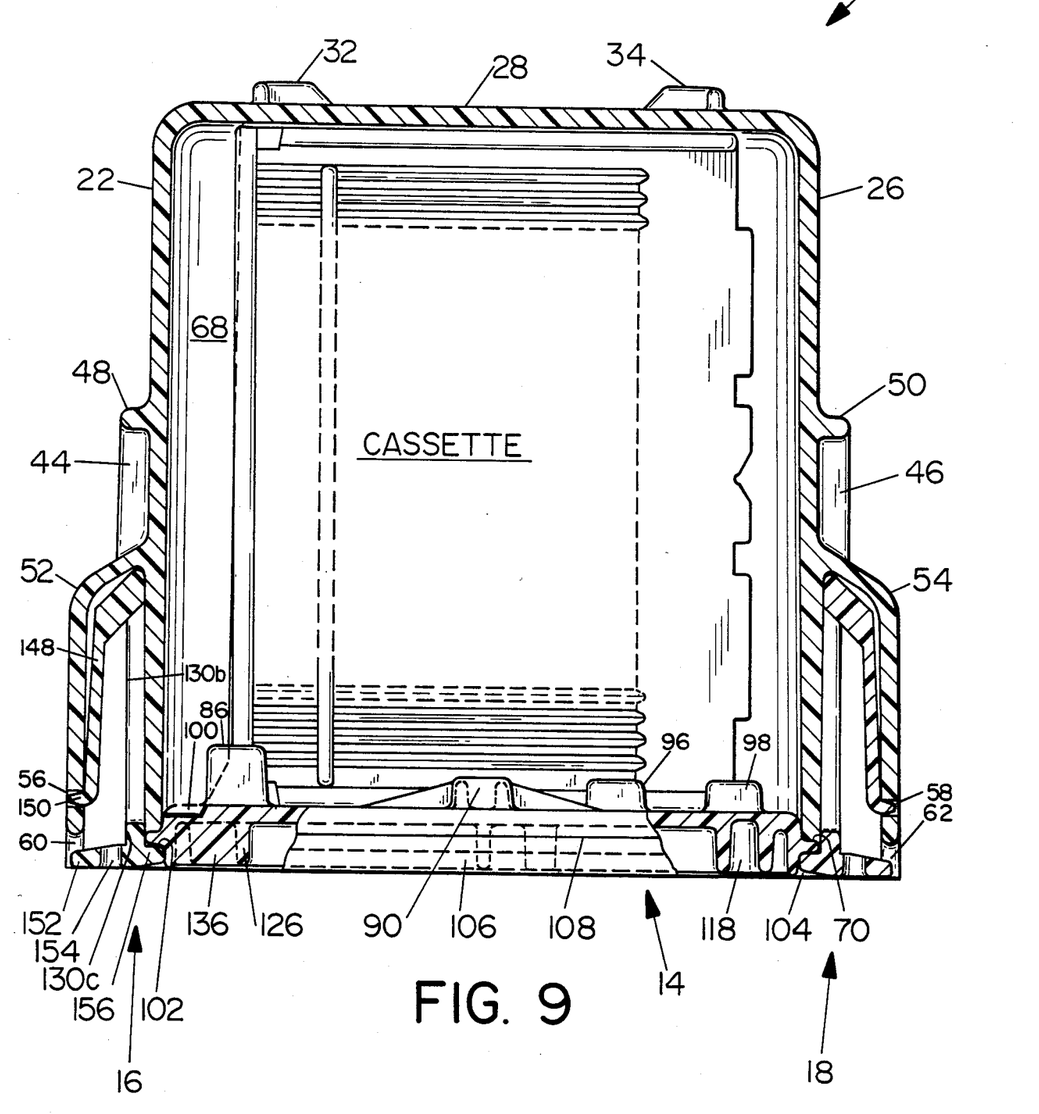

FIG. 1 illustrates a perspective view of a standard mechanical interface (SMIF) storage box 10 including a box 12, a door 14, and locking clips 16 and 18 where the components 12–18 are separated from each other for purposes of illustration. The box 12 includes four sides 20, 22, 24, and 26, and a top 28. Four right angle stacking tabs 30, 32, 34 and 36 extend upwardly from the top 28. The stacking tabs are for engaging the bottom side of the door 14, as later described in detail, and also serve as support feet for the box 12. A run card area 38 is provided between run card slot tabs 40 and 42 which extend upwardly and outwardly accordingly. Handle areas 44 and 46 located within outwardly extending handles 48 and 50, as also illustrated in FIG. 2, are provided for manual pick up by an individual's hands or a robotic gripper pick up. Outboard spring clip locking retaining enclosures 52 and 54, as also shown in FIGS. 7 and 9, encompass the locking clip 16 and 18 upon engagement. Each outboard clip enclosure is also provided with locking slots 56 and 58, and latch pin opening 60 and 62, as also illustrated in FIGS. 4, 7, and 9. Perimeter flanges 64 and 66 extend about the lower edge of the box, as also illustrated in FIG. 3.

Figure 6:
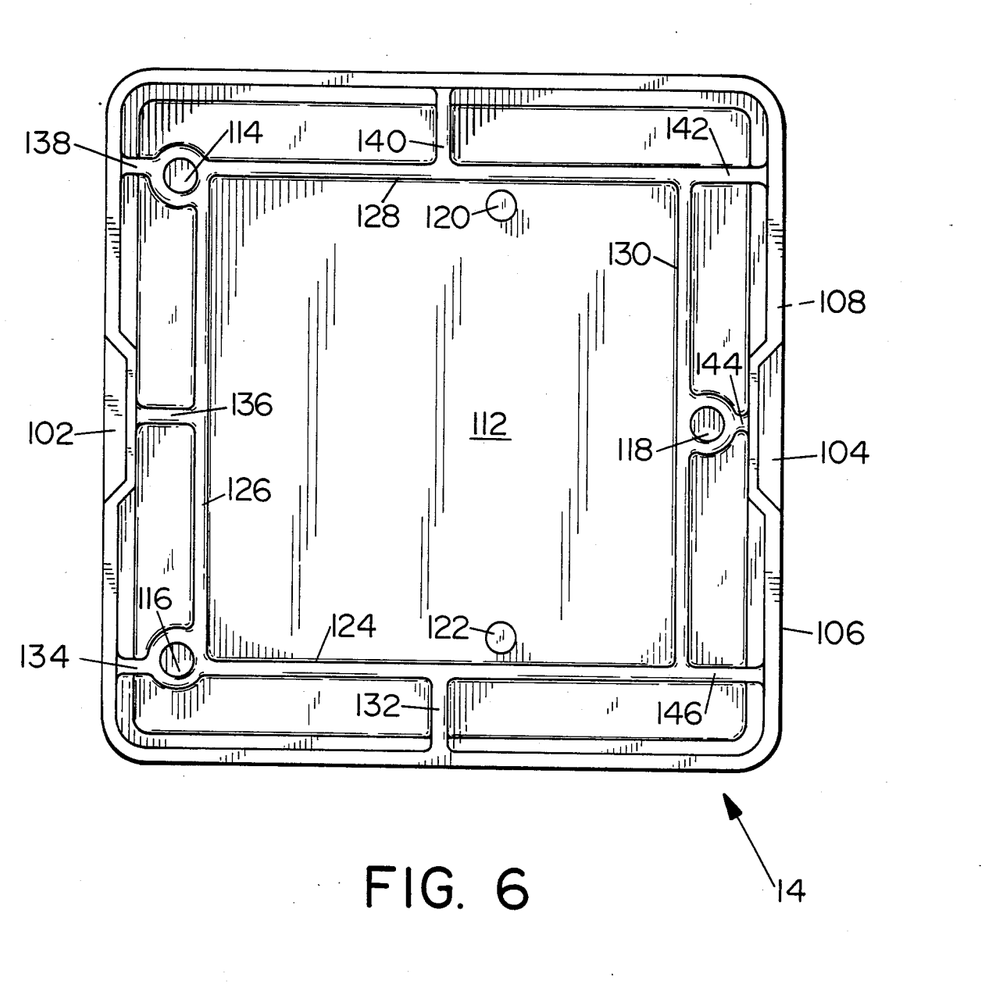
FIG. 6 illustrates a bottom view of the box door.

The door includes two pairs of cross-bar wafer processing cassette locators 80 and 82, two top flange locator pins 84 and 86, two metal wafer processing cassette locator tabs 88 and 90, and four goof proof tabs 92, 94, 96 and 98 so that a cassette cannot be put in backwards. An alignment detent 100 is provided which mates to a wafer locator rib 68 of FIGS. 2, 3 and 7 for the box 12. Lock interface grooves 102 and 104, as illustrated in FIG. 6, are provided for the locking clips 16 and 18.

The locking clip 16, which is identical in structure to the locking clip 18, includes a spring arm 148, a lock retainer 150, a latch pin arm 152, a latch pin hole 154, a spring latch 156 where the components 152-156 are affixed to the bottom of a clip surface 130. Spring arm 148 engages the lock retainer 150 into slot 56. Members 130a and 130b also provide spring action for the spring latch 156 acting against spring arm 148. In a rest position, the back side of the flat planar spring surfaces 130a and 130b are in direct surface contact with the side 22 of the box 12 as is the back side of bottom planar spring surface 130c. The spring clips 16 and 18 are geometrically configured providing for inherent spring action during spring movement with the slots 52 and 54.

The box 12, door 14, and clips 16 and 18 are made of a suitable polymer or like material. The material can include protective electrostatic properties and ulta-violet filtering as required.

FIG. 2 illustrates a front view of the box 12 where all numerals correspond to those elements previously described. A wafer retaining rib 68 is affixed to the inner wall of side 22 and the inner wall of the top 28 of the box 12. The handles 48 and 50 and handle areas 44 and 46 are illustrated with respect to the outboard locking clip enclosures 52 and 54.

FIG. 3 illustrates a top view of the box where all numerals correspond to those elements previously described.

FIG. 4 illustrates a bottom view of the box where all numerals correspond to those elements previously described. Particularly illustrated is the continuous inner perimeter support edge 70 for supporting the box door 14. Also illustrated are the latch pin openings 60 and 62 and the locking slots 56 and 58 as illustrated in dashed lines for conjunction with the locking clips 16 and 18.

Figure 5:
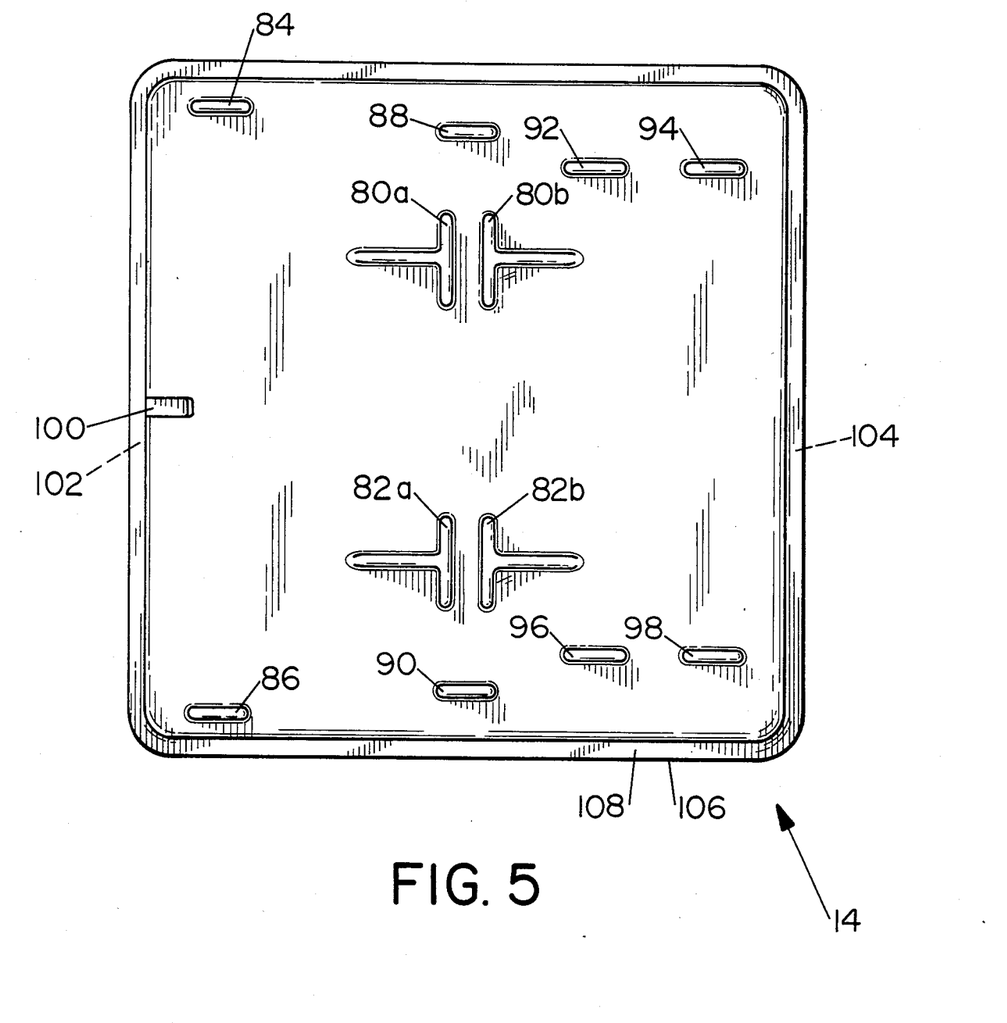
FIG. 5 illustrates a top view of the box door.

FIG. 5 illustrates a top view of the box door where all numerals correspond to those elements previously described. A cross bar would engage in between members 80a-80b and 82a-82b.

FIG. 6 illustrates a bottom view of the box door 14. The edge 106 is illustrated, as well as the under side of the lip 108. Registration pin holes 114, 116, and 118 are positioned for locating and registering of the box door 14, and extend downwardly from the bottom 112. Likewise, sensor trip pins 120 and 122 extend downwardly for tripping switches in the port plate of the SMIF equipment. Perimeter members 124, 126, 128 and 130 extend downwardly in a rectangular configuration for providing for stacking with the tabs 30-36 of the box 12. Members 124-146 also provide structural support and integrity for the door 14.

MODE OF OPERATION

FIG. 7 illustrates a side view of the box 12, the door 14, and the locking clips 16 and 18 where the components are separated prior to insert forming the SMIF storage box. The locking clips 16 and 18 engage into the box 12 prior to the door 14 being positioned into the box, but the clips can be positioned into the outboard clip enclosures after the door 14 has been engaged into the box 12. All numerals correspond to those elements previously described.

Figure 8:
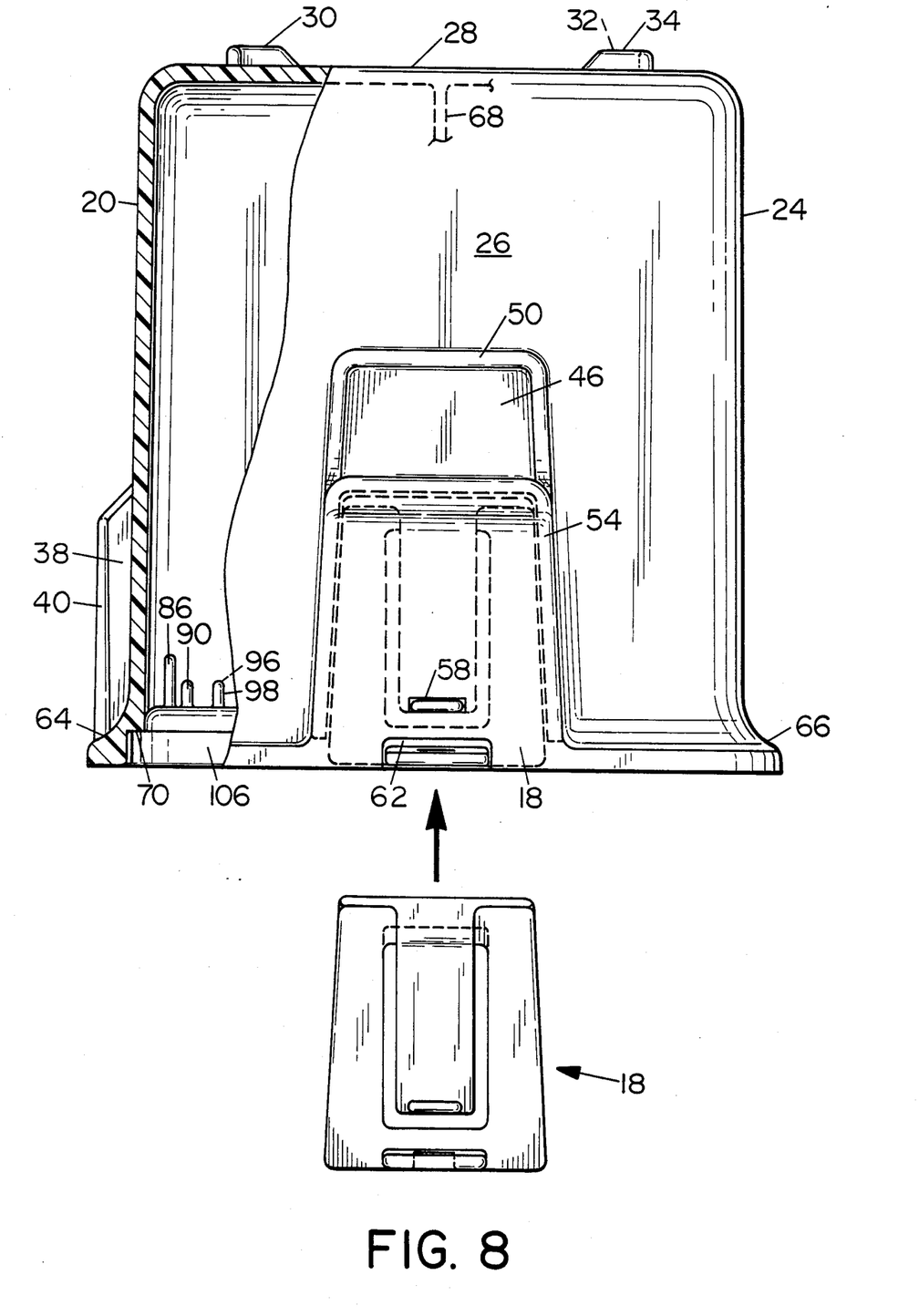
FIG. 8 illustrates a side elevation and partial cutaway of the box door engaged within the storage box and a locking clip prior to and after insertion; and, FIG. 9 illustrates a cutaway cross-section side view of the assembled box, door, and locking clips and a wafer cassette engaged within the storage box.

FIG. 8 illustrates a side view and partial cutaway of the box 12 with the door 14 positioned therein, and a locking clip 18, which is identical to that of clip 16 prior to being engaged in the outboard clip enclosure, and then actually engaged within the clip enclosure. All numerals correspond to those elements previously described.

FIG. 9 illustrates a cutaway partial section side view of the storage box 10 including the components of the box 12, the door 14, and the locking clip 16 and 18 all engaged and supporting a cassette therein with wafers. The outline of the cassette is shown, but for purposes of brevity and sake of illustration, the particular wash slots, as well as other structural detail of the wafer cassette, have not been shown in detail. The particular locking mechanisms of the locking clip, as illustrated two-fold with a lock retainer 150 engaged into the locking slot 56 and the spring latch 156 engaged into and about the lock interface detent 102. The clip members 130a and 130b provide spring for movement of the spring latch surface 156 away from the lock interface detent 102 about the spring arm 148.

We claim:
1. Storage box for a wafer processing cassette comprising:
   a. box including four sides and a top, outwardly extending handle areas positioned on two opposing sides, outboard spring clip locking retaining means positioned on said opposing sides and adjacent box opening, a perimeter flange extending substantially about said four sides and adjacent said box opening, and means for supporting the box door within said box;
   b. box door including a plurality of geometrically spaced upwardly extending means for locating the wafer processing cassette on end on an upper side of said box door, and two opposing lock interface means on a lower side of said box door; and,
   c. spring clip means including a locking retainer means for engaging in said spring clip locking retaining means of said box and a spring latch means for engaging against said two opposing lock interface means of said box, said locking retainer means and said spring latch means on opposing ends of said spring clip means.

* * * * *